(12) United States Patent
Kroener et al.

(10) Patent No.: US 7,916,493 B2
(45) Date of Patent: Mar. 29, 2011

(54) POWER SEMICONDUCTOR MODULE

(75) Inventors: Friedrich Kroener, Villach (AT); Anton Mauder, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 561 days.

(21) Appl. No.: 11/536,384

(22) Filed: Sep. 28, 2006

(65) Prior Publication Data

US 2007/0076390 A1    Apr. 5, 2007

(30) Foreign Application Priority Data

Sep. 30, 2005   (DE) .................. 10 2005 047 106

(51) Int. Cl.
*H05K 7/00* (2006.01)
(52) U.S. Cl. ........................... 361/760; 174/256
(58) Field of Classification Search .......... 361/765–768, 361/771, 780, 783, 784, 792–795, 734, 760; 174/255, 260, 262; 257/700–703, 723, 724
See application file for complete search history.

(56) References Cited

U.S. PATENT DOCUMENTS

| | | | |
|---|---|---|---|
| 4,766,481 A | 8/1988 | Gobrecht et al. | |
| 5,135,595 A | 8/1992 | Acocella et al. | |
| 5,856,913 A * | 1/1999 | Heilbronner | 361/760 |
| 6,208,019 B1 * | 3/2001 | Tane et al. | 257/679 |
| 6,329,603 B1 * | 12/2001 | Japp et al. | 174/255 |
| 6,507,497 B2 * | 1/2003 | Mashino | 361/767 |
| 2003/0205803 A1 * | 11/2003 | Kawamoto | 257/700 |
| 2007/0209178 A1 * | 9/2007 | Savic et al. | 29/25.41 |
| 2008/0122066 A1 * | 5/2008 | Ishii | 257/703 |

FOREIGN PATENT DOCUMENTS

| | | |
|---|---|---|
| DE | 242308 | 1/1987 |
| DE | 3538933 A1 | 5/1987 |
| DE | 19509202 A1 | 9/1995 |
| DE | 68923717 T2 | 4/1996 |
| DE | 69115799 T2 | 7/1996 |
| DE | 19617055 C1 | 6/1997 |
| DE | 19640192 A1 | 4/1998 |
| DE | 10019483 A1 | 10/2001 |
| DE | 10037819 | 2/2002 |
| DE | 10037819 A1 * | 2/2002 |
| DE | 10159020 C1 | 3/2003 |
| DE | 10248683 | 4/2004 |
| DE | 10249854 A1 | 5/2004 |
| DE | 10249855 A1 | 5/2004 |

OTHER PUBLICATIONS

U.S. Appl. No. 60/288,365, filed Feb. 22, 2000, Akram et al.

* cited by examiner

*Primary Examiner* — Yuriy Semenenko
(74) *Attorney, Agent, or Firm* — Coats & Bennett PLLC

(57) ABSTRACT

A power semiconductor module has a controllable semiconductor chip (50), a first printed circuit board (1), a second printed circuit board (2), and also has one or a plurality of passive components (13, 18). The first printed circuit board (1) may have a conductor track structure (12, 13, 14), and the second printed circuit board (2) may have a conductor track structure (21, 22, 23, 24). Furthermore, an opening (19) in which the semiconductor chip (50) is arranged can be provided in the first printed circuit board (1). Furthermore, at least one passive component (13, 18) can be arranged on the first printed circuit board (1) or on the second printed circuit board (2).

28 Claims, 6 Drawing Sheets

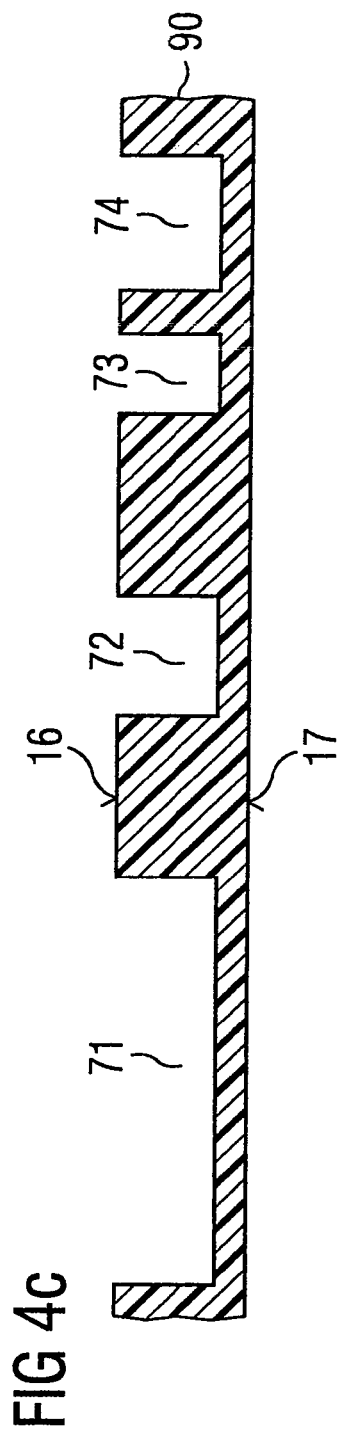
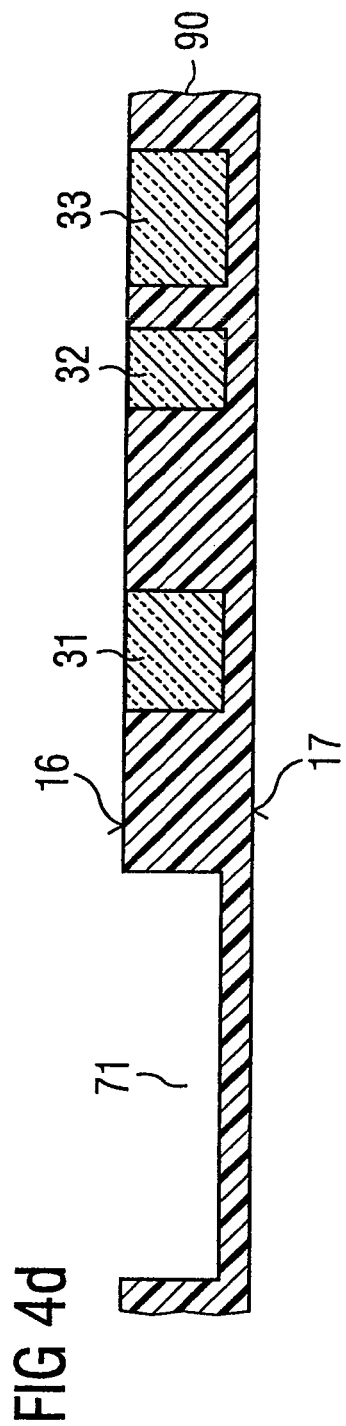
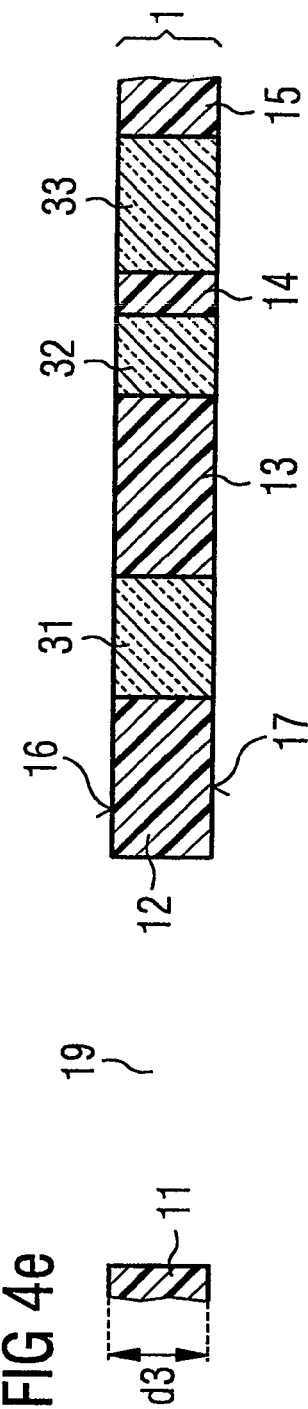
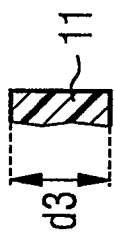

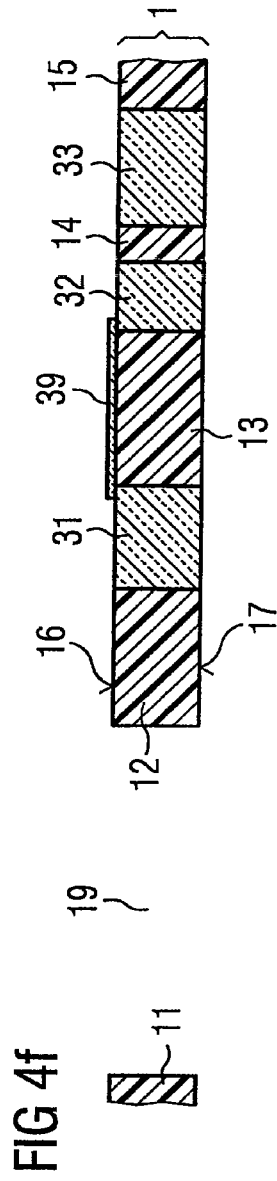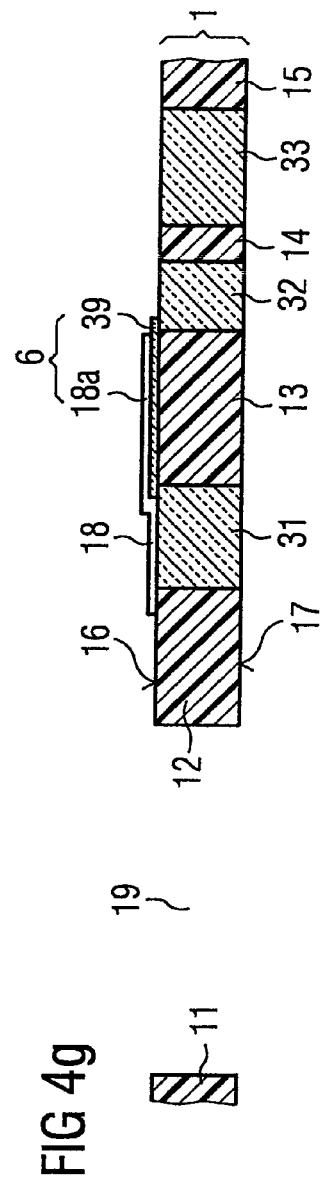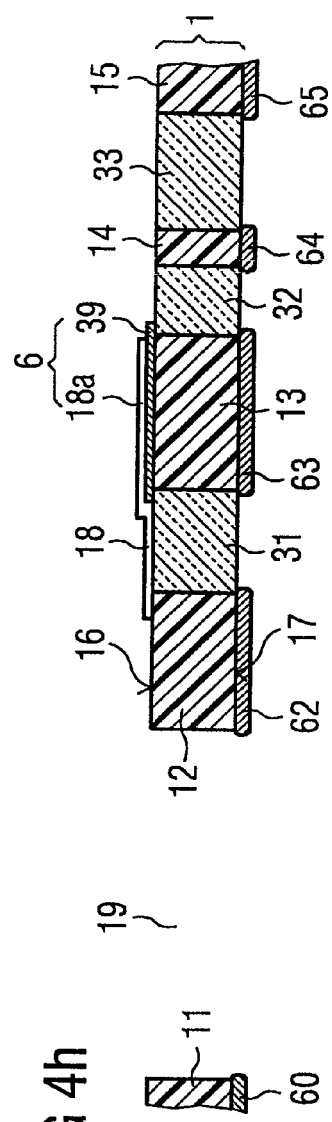

US 7,916,493 B2

POWER SEMICONDUCTOR MODULE

PRIORITY

This application claims priority from German Patent Application No. DE 10 2005 047 106.4 which was filed on Sep. 30, 2005, and is incorporated herein by reference in its entirety.

TECHNICAL FIELD

The invention relates to a power semiconductor module comprising a semiconductor chip and the interconnection thereof.

BACKGROUND

Power semiconductor modules have one or a plurality of semiconductor chips which have to be connected up to connections of the module and/or to one another.

For this purpose, the semiconductor-chips are usually mounted on a carrier by one side and, on the other side, are electrically connected by means of bonding wires to other semiconductor chips or to external connections of the module.

The advancing miniaturization of the semiconductor chips means that the current density in the semiconductor chips rises with the chip area remaining the same, which makes it more difficult to achieve sufficient dissipation of heat from the semiconductor chips. In particular that side of a semiconductor chip which is contact-connected with bonding wires makes no significant contribution to the heat dissipation from the chip.

Furthermore, such bonding wires act as an inductance which together with the junction capacitance of a semiconductor chip formed as a power switch form a resonant circuit. The resonant frequency of such a resonator circuit is in the region of about 100 MHz in the case of a typical power switch having an area of 1 cm².

If the load current is subjected to chopping in the power switch, then undesirable oscillations may thereby be excited owing to its great variation with respect to time.

Such power switches, in a power semiconductor module, are usually mounted on a DCB substrate (DCB=Direct Copper Bonding) comprising a copper-coated aluminum oxide ceramic. The copper coating of such a DCB substrate together with the conduction resistance of the bonding wires used for the connection of the power switch form a parasitic low-pass filter which, however, manifests a blocking effect sufficient for suppressing the abovementioned resonant frequency only at frequencies from approximately 1 THz.

A further problem occurs in power semiconductor modules comprising a plurality of drivable semiconductor chips, for example if the load paths thereof are connected in parallel and the semiconductor chips are intended to be driven synchronously externally. This necessitates, for each of the drivable semiconductor chips, a series resistor which is connected upstream of the control input of the respective semiconductor chip and is generally integrated in the relevant semiconductor chip.

Together with the input capacitances of the semiconductor chips said series resistors form low-pass filters, whereby transfer oscillations of the load current flowing through the semiconductor chips are suppressed.

With this type of circuitry, however, the control connections of the semiconductor chips are no longer directly connected to a driving electronic unit arranged outside the semiconductor chips, which results in delays during the driving of the semiconductor chips.

This in turn requires an increased circuit complexity in the driving electronic unit, particularly if high switching speeds are required.

It can thus happen, primarily when turning off the semiconductor chips, on account of parasitic capacitances, that the maximum voltage permissible across the load paths of the semiconductor chips is exceeded.

Situations of this type can be avoided by the relevant semiconductor chips being momentarily switched on again, which as a result leads to a softer turn-off behavior of the semiconductor chips. However, the process of momentary switching-on again has to be effected very rapidly, for which reason the semiconductor chips have to be able to be driven correspondingly rapidly. However, the maximum switching frequency is limited by the resistors integrated in the semiconductor chips and by the input capacitances of the semiconductor chips.

SUMMARY

A power semiconductor module may comprise a controllable semiconductor chip, a first printed circuit board, a second printed circuit board, and one or several passive components, wherein the first printed circuit board has a conductor track structure, and also an opening in which the semiconductor chip is arranged, the second printed circuit board has a conductor track structure, and wherein the one passive component or each of the plurality of passive components are arranged either on the first printed circuit board or on the second printed circuit board.

BRIEF DESCRIPTION OF THE DRAWINGS

Embodiments of the invention are explained in more detail below with reference to figures, in which.

DETAILED DESCRIPTION

Figure 1:
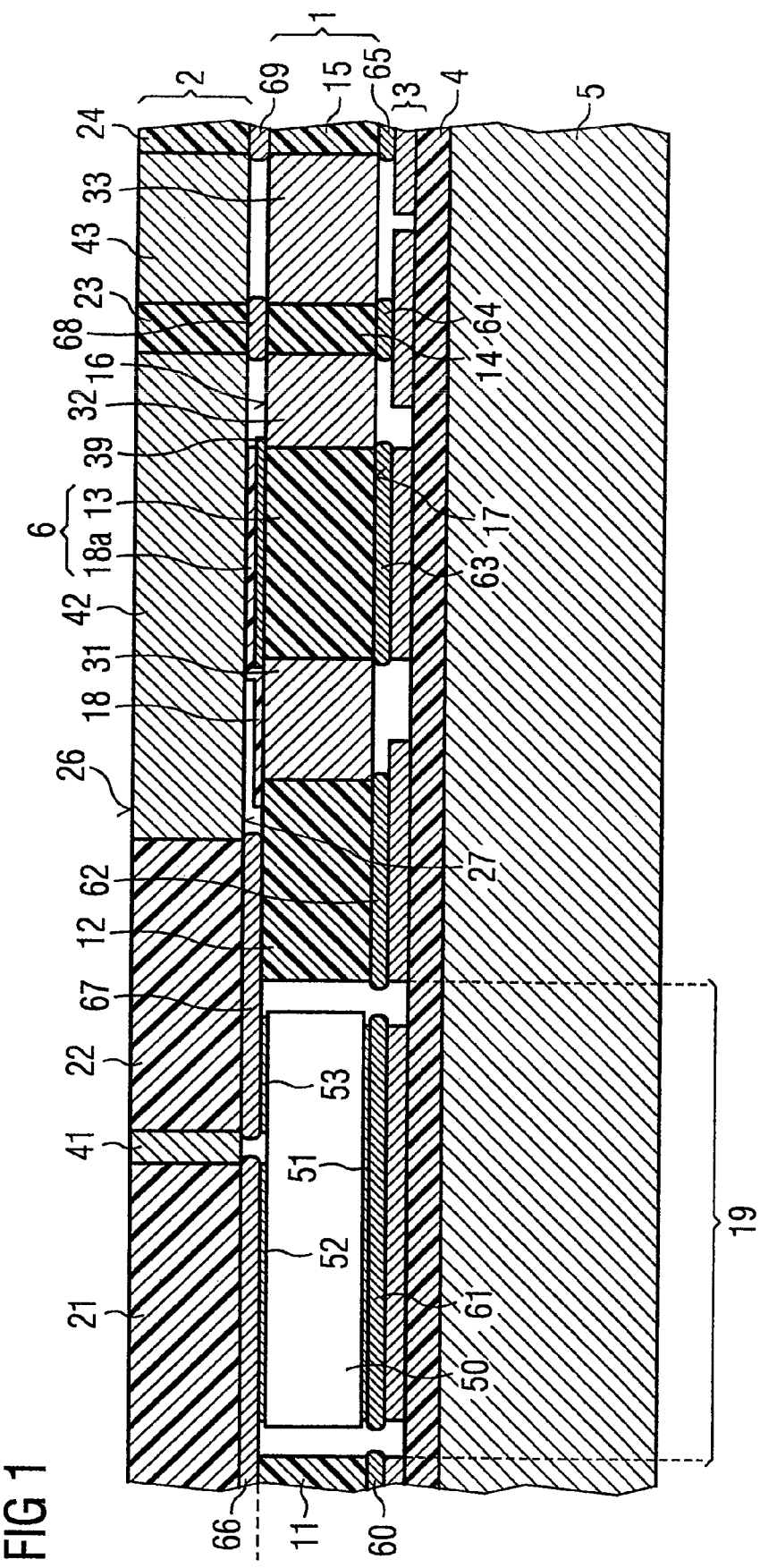
FIG. 1 shows a cross section through a section of a power semiconductor module according to an embodiment, in which a first printed circuit board, into which a semiconductor chip is inserted, is arranged between a second printed board and a conductor layer, and in which a resistor and a capacitor are arranged on the first printed circuit board.

A power semiconductor module according to an embodiment may have a controllable semiconductor chip, and also a first printed circuit board and a second printed circuit board each having a conductor track structure. Furthermore, an opening in which the semiconductor chip is arranged is provided in the first printed circuit board.

Furthermore, the power semiconductor module may comprise one or a plurality of passive components, each of which can be arranged on the first printed circuit board or on the second printed circuit board. Such passive components, in particular resistors and capacitors, may be produced as pastes by means of screen printing techniques in a simple manner on the printed circuit boards and be integrated in the conductor track structure thereof.

If a possibly patterned conductor layer arranged on an insulating carrier plate, for example, is positioned on the side remote from the second printed circuit board, then this gives rise to a sandwich-like construction in which the first printed circuit board with the semiconductor chip inserted in the opening thereof is arranged between the second printed circuit board and the conductor layer.

In this way, the semiconductor chip, on two mutually opposite sides, can be electrically and/or mechanically connected to the conductor layer, on the one hand, and to the second printed circuit board, on the other hand. Moreover, the heat loss arising in the semiconductor chip can be emitted both to the second printed circuit board and to the conductor layer.

A further advantage of the interconnection of the semiconductor chip by means of a first and a second printed circuit board may consist in the fact that one or a plurality of passive components may also be arranged on said printed circuit boards. This may enable simple and individual adaptation of the power semiconductor module to the respective requirements.

In particular the series resistor connected upstream of the control input of the semiconductor chip may be arranged on one of the two printed circuit boards instead of integrating it into the semiconductor chip.

The arrangement of the semiconductor chip in an opening of the first printed circuit board means that the power semiconductor module has a very compact construction. Primarily a series resistor connected upstream of the control input of the semiconductor chip or an input filter at the control input may be arranged spatially very close to the semiconductor chip, so that no significant interference inductances arise and the semiconductor component remains insensitive to external interference fields.

It goes without saying that in the power semiconductor module even further semiconductor chips may be arranged in the manner described in openings of the first or second printed circuit board and, by means of the two printed circuit boards, may be interconnected and may be connected up to components arranged on the two printed circuit boards.

Besides electrical resistors, as passive components capacitors, in particular, may be realized on one or both of the printed circuit boards.

Such resistors or capacitors are preferably embodied as printed components produced from a paste that is applied to the relevant printed circuit board, e.g. by means of the screen printing method.

A further advantage of such a power semiconductor module, which results from the use of the printed circuit boards for the production of the electrically conductive connections, consists in the fact that bonding wire connections, in particular bonding wire connections for the electrical connection of the semiconductor chip, can be dispensed with.

Moreover, the mounting of the power semiconductor module is simplified since the printed circuit boards and the passive and optionally also active components arranged thereon can be premounted. The printed circuit boards prepared in this way can subsequently be mounted together with the semiconductor chip. In particular, it is possible for all the soldering connections required between the semiconductor chip and the printed circuit boards and all the soldering connections required between the two printed circuit boards to be embodied in one soldering step. The complex production of bonding wire connections can thus be obviated.

In the figures—unless specified otherwise—identical reference symbols designate identical parts with the same meaning.

FIG. 1 shows a section of a power semiconductor module according to an embodiment in cross section. The power semiconductor module comprises a first printed circuit board 1 arranged between a second printed circuit board 2 and a conductor layer 3. The conductor layer 3 may be formed in patterned fashion, as illustrated, or in unpatterned fashion.

The first printed circuit board 1 comprises electrically conductive sections 11, 12, 13, 14, 15, which are spaced apart from one another and are mechanically connected to one another by sections 31, 32, 33 of a dielectric.

The second printed circuit board 2 correspondingly comprises electrically conductive sections 21, 22, 23, 24 which are spaced apart from one another and are mechanically connected to one another by sections 41, 42, 43 of a dielectric.

In the first printed circuit board 1, an opening 19 is provided in which a semiconductor chip 50 comprising a first load connection 51, a second load connection 52 and also a control connection 53 is arranged. The first load connection 51 is connected to the conductor layer 3 by means of a soldering layer 61. The printed circuit board 1 approximately has the thickness of the semiconductor chip 50, that is to say preferably 50 μm to 350 μm.

The semiconductor chip 50 may be formed for example as a MOSFET (metal-oxide-semiconductor field-effect transistor) or IGBT (insulated gate bipolar transistor), in which the first load connection 51 constitutes the drain or collector connection, respectively, the second load connection 52 constitutes the source or emitter connection, respectively, and the control connection 53 constitutes the gate connection.

The second load connection 52 and the control connection 53 are arranged opposite the first load connection 51 and are connected to conductive sections 21 and 22, respectively, of the second printed circuit board 2 by means of soldering layers or eutectic bonding connections 66 and 67, respectively. The semiconductor chip 50 is thus cooled from its mutually opposite main areas via the second printed circuit board 2, on the one hand, and the conductor layer 3, on the other hand.

A further improvement of the heat dissipation results from the fact that the conductor layer 3 is applied to an insulating carrier plate 4, which is in turn in thermal contact with a further conductor layer 5.

The conductor layer 5 may be directly connected to a heat sink (not illustrated) which emits the heat loss arising in the power semiconductor module to a cooling medium—air in the simplest case. As an alternative, one or a plurality of power semiconductor modules according to FIG. 1 may be fixed for example by means of a soldering connection on a baseplate, which, for its part, is in good thermal contact with a heat sink or a cooling area. Integration onto a baseplate makes it possible to increase the integration density in power semiconductor modules and/or to improve the producibility.

The insulating carrier plate 4 is preferably formed from ceramic, for example from aluminum oxide. The conductor layer 3 may be applied to the insulating carrier plate 4 for example from a thick-film silver paste or galvanically as a copper layer.

The insulating carrier plate 4, the conductor layer 3 and the conductor layer 5 particularly preferably form a DCB substrate (DCB=Direct Copper Bonding) in which the conductor layer 3 and the conductor layer 5 contain or are formed from copper or a copper alloy and are bonded onto the insulating carrier plate 4 comprising aluminum oxide. As an alternative to this, it is also possible for only the conductor layer 3 to be bonded onto the insulating carrier plate 4. The conductor layer 5 may be patterned or unpatterned and, in a departure from the present illustration, may also have the same thickness as the conductor layer 3.

The dielectric 31, 32, 33 of the first printed circuit board 1 and the dielectric of the sections 41, 42, 43 of the second printed circuit board 2 are preferably glass, a glass-containing fabric, a plastic molding composition or an imide. Glass and glass-containing fabric have two advantages over a plastic molding composition, however. Firstly, they have a lower coefficient of thermal expansion, and secondly a better thermal conductivity than plastic. The dielectric preferably comprises the substances silicon dioxide ($SiO_2$), aluminum oxide ($Al_2O_3$) and zinc oxide (ZnO).

The electrically conductive sections 11, 12, 13, 14 and 15 and the dielectric sections 31, 32, 33 of the first printed circuit board 1 extend in the vertical direction continuously from the first side 16 of the first printed circuit board 1 as far as the second side 17 thereof. Correspondingly, the electrically conductive sections 21, 22 and 23 and the dielectric sections 41, 42, 43 of the second printed circuit board 2 extend in the vertical direction continually from the first side 26 of the second printed circuit board 2 as far as the second side 27 thereof.

The electrically conductive sections 11, 12, 13, 14, 15, 21, 22, 23 and 24 thus perform a dual function both as conductor track and as plated-through holes, since the electrically conductive sections 11, 12, 13, 14, 15, 21, 22, 23 and 24 are accessible from mutually opposite sides of the relevant printed circuit board 1 and 2, respectively.

In the case of the present arrangement, the function of a plated-through hole is readily discernible particularly in the case of the electrically conductive section 14 of the first printed circuit board 1. The section 14 is on the one hand connected by means of a soldering layer 64 to the conductor layer 3 and is on the other hand connected by means of a soldering layer 68 to the electrically conductive section 23 of the second printed circuit board 2.

By means of printed circuit boards 1, 2 constructed in this way, one or a plurality of semiconductor chips may be interconnected and be externally contact-connected. According to an embodiment, at least one passive component is provided on at least one of the two printed circuit boards 1, 2.

In the present exemplary embodiment, this is firstly a resistance layer 18 applied to the first printed circuit board 1. The resistance layer 18 is preferably formed as a paste that is printed onto the first printed circuit board 1 by means of a screen printing method and is then sintered.

Suitable materials for the paste for the production of such a resistance layer 18 are—for the production of resistance layers 18 having a low resistance—in particular alloys which are based on noble metals such as Ag, Au, Cu, Pd, Pt and—for the production of resistance layers 18 having a high resistance—for example ruthenium-doped glass or so-called cermet materials (tungsten, titanium, tantalum or niobium carbide) which are sintered with nickel as binder and conductor.

It is also possible to use different materials for different resistance layers 18 on a printed circuit board 1 in order to realize different resistance values or low-resistance connection pads e.g. for capacitors.

Furthermore, a section 18a of said resistance layer 18 together with the electrically conductive section 13 of the printed circuit board 1 form a capacitor 6.

Situated between the section 13 and the section 18a is a dielectric layer 39, which, prior to the resistance layer 18 being printed on, was likewise printed onto the first printed circuit board 1 above the electrically conductive section 13 and was then sintered.

Pastes comprising barium titanate or comprising barium strontium titanate (BST) are preferably suitable for the production of the dielectric layer 13, owing to their high dielectric constant.

The pastes preferably have a ceramic basic substance, for example titanium dioxide ($TiO_2$), which may optionally be provided with additives such as barium oxide (BaO) and/or lanthanum oxide ($LA_2O_3$) and/or neodymium oxide ($Nd_2O_5$), as a result of which it is also possible to produce capacitors having outstanding temperature and/or radiofrequency properties. Capacitors 6 produced in this way are outstandingly suitable for use in driving circuits for driving the semiconductor chip 50.

High-pass and/or low-pass filters can be realized in a simple manner with resistors and capacitors printed on in this way. Such resistors, capacitors and also other components may be arranged not just on the first side 16 of the first printed circuit board 1, but in principle also on the second side 17 of the first printed circuit board 1 and on the first side 26 and/or second side 27 of the second printed circuit board 2.

With an arrangement chosen according to FIG. 1, the electrical resistance and the inductance of the bonding wires of a power semiconductor module in accordance with the prior art, which are used for the connection of at least one of the load connections of the semiconductor chip, can be replaced by the electrical resistance of the resistance layer 18 and, respectively, the inductance of the electrically conductive section 21 of the second printed circuit board 2.

Moreover, the capacitance of such a power semiconductor module in accordance with the prior art, which is formed by the capacitance of the DCB substrate, may, in the power semiconductor module according to an embodiment, be replaced by the capacitance of the capacitor 6 in accordance with FIG. 1 or be drastically increased by the capacitor 6 being electrically connected in parallel.

As a result, by means of a power semiconductor module constructed according to FIG. 1, a resonant frequency of about 1 GHz can be achieved instead of the resonant frequency of approximately 100 MHz mentioned in the introduction, while at the same time the filter frequency of the low-pass filter mentioned is at a frequency of approximately 300 MHz, so that the turn-off oscillations mentioned in the introduction are adequately suppressed and a soft turn-off of the power switch is simultaneously ensured.

A further advantage of an arrangement in accordance with FIG. 1 consists in the fact that the monitoring circuits for voltage limiting ("snubber" circuits) can act directly at the power switch and are not decoupled by lead inductances. Such "snubber" circuits usually comprise capacitors and resistors, optionally with additional diodes.

In accordance with one embodiment, the electrically conductive sections 11, 12, 13, 14, 15 of the first printed circuit board 1, the electrically conductive sections 21, 22, 23, 24 of the second printed circuit board 2, the conductor layer 3 and the heat sink 5 may, independently of one another, be formed from hybrid fibers that are sintered together.

Figure 2A:
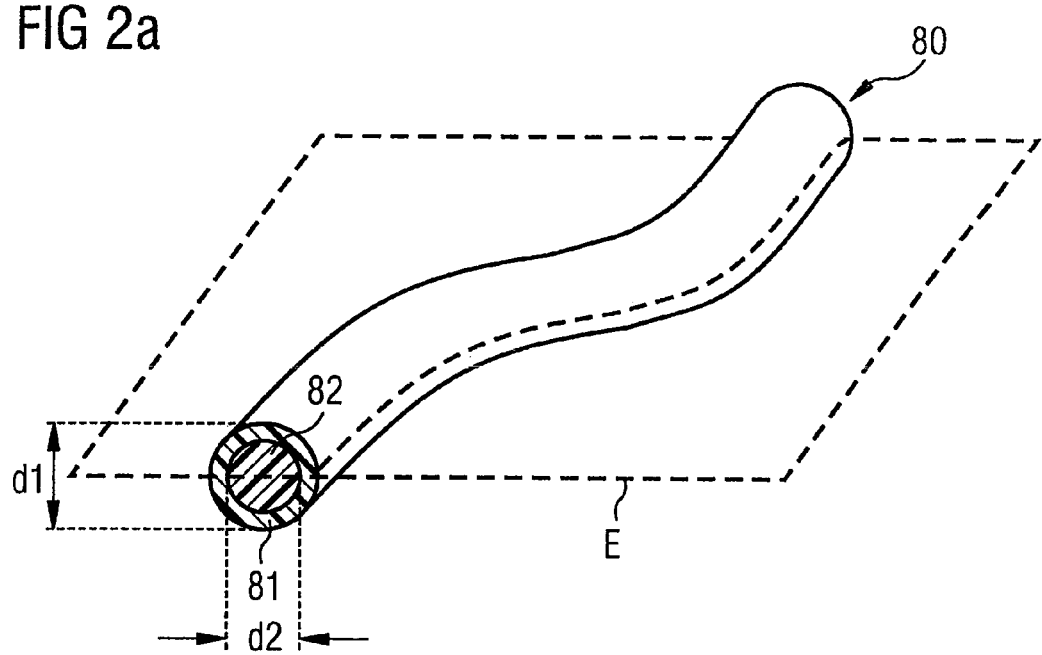
FIG. 2 shows a hybrid fiber comprising a carbon fiber sheathed with metal for the production of the printed circuit boards in accordance with FIG. 1.

FIG. 2a shows such a hybrid fiber 80 in perspective view. The hybrid fiber 80 comprises a carbon fiber 82 provided with a sheathing 81 made of a metal, preferably copper or a copper alloy. The hybrid fiber 80 has a diameter d1 of preferably 7 μm to 18 μm, and the carbon fiber 82 has a diameter d2 of preferably 5 μm to 15 μm, particularly preferably 10 μm. The illustration of the hybrid fiber 80—both in FIG. 2a and in the subsequent FIGS. 2b and 3a to 3c—is not true to scale.

The hybrid fiber 80 has good electrical conductivity due to the metal sheathing 81. At the same time, the hybrid fiber 80 has a linear thermal expansion coefficient which, on account of the carbon fiber 82, is significantly lower than the linear thermal expansion coefficient of the metal of the sheathing 81.

Both the electrical and the thermal conductivity of such hybrid fibers 80 are excellent due to the particularly material combination. Consequently, hybrid fibers 80 of this type are outstandingly suitable for the production of power semiconductor modules according to an embodiment.

Figure 2B:
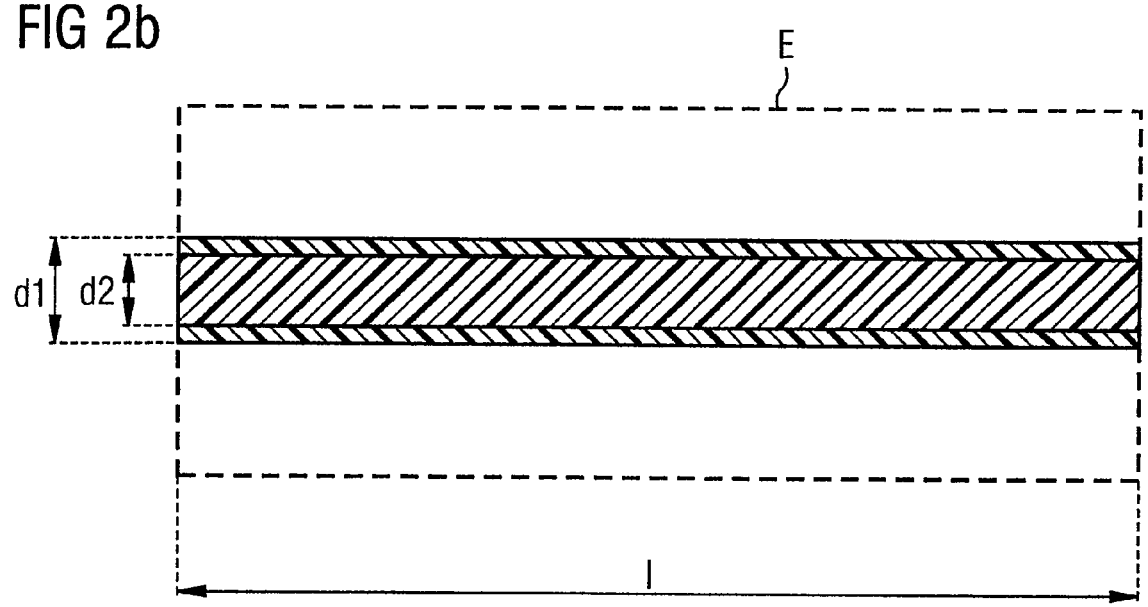

FIG. 2*b* shows a horizontal section through a hybrid fiber 80 in accordance with FIG. 2*a* in a plane E, the hybrid fiber 80 being stretched in a departure from the illustration in FIG. 1. The length 1 of the hybrid fiber 80 is preferably at least 1 mm, particularly preferably at least 1 cm to several centimeters.

Figure 3A:
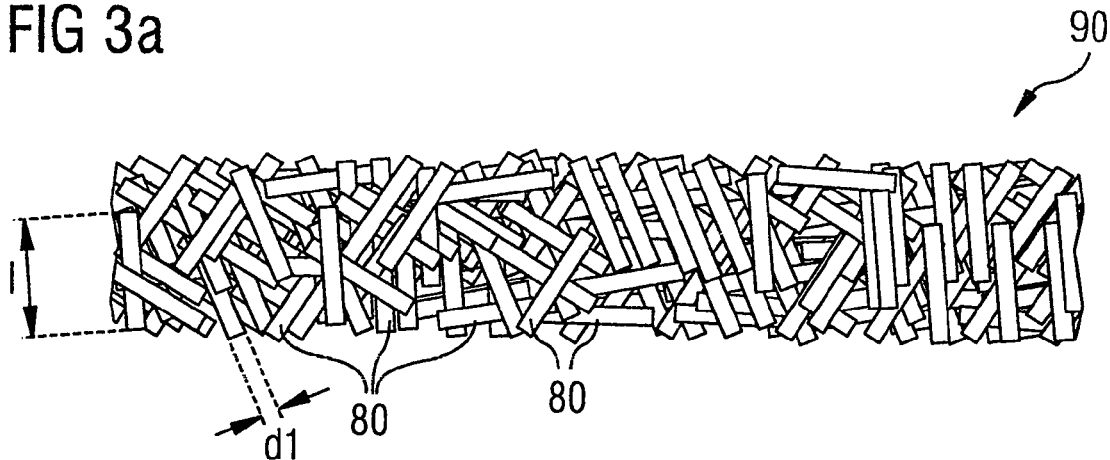
FIG. 3 shows a cross section through a basic body formed from a multiplicity of hybrid fibers in accordance with FIG. 2.

FIG. 3*a* shows a cross section through a sintered body 90, having a first side 91 and a second side 92, which sintered body is formed from a multiplicity of such hybrid fibers 80 which are arranged in laminar fashion and sintered together.

By way of example, the electrically conductive sections 11, 12, 13, 14, 15 of the first printed circuit board 1 the electrically conductive sections 21, 22, 23, 24 of the second printed circuit board 2, the conductor layer 3 and the heat sink 5 may, independently of one another, be produced from such a layer.

In order to produce the sintered body 90, the hybrid fibers 80 are pressed onto one another at a high pressure of preferably 20 MPa to 50 MPa and are pressed onto one another at a high temperature of preferably 750° C. to 950° C., so that, at the contact locations of adjacent hybrid fibers 80, sintering connections arise between the metal sheathings thereof. On account of the large total metal surface area of the hybrid fibers 80, the sintered body 90 has an outstanding electrical conductivity.

If a suitable negative mold is used for the production of the sintered body 90, then the sintered body 90 may be produced in virtually any desired forms, in particular also forms that deviate from a laminar form.

Furthermore, owing to the carbon fibers contained in the hybrid fibers 80, the coefficient of thermal expansion of the sintered body 90 is significantly lower than the coefficient of thermal expansion of the metal of the metal sheathing enclosing the carbon fibers.

Depending on the type of carbon fibers used for the hybrid fibers 80, a linear thermal expansion coefficient of between about $4.0 \cdot 10^{-6}$/k and $16.8 \cdot 10^{-6}$/K can be set—in the case of a metal sheathing of the carbon fibers made of copper—for the sintered body 90. The linear thermal expansion coefficient of silicon as typical semiconductor material for the production of a semiconductor chip lies between these values with a value of about $7.0 \cdot 10^{-6}$/K. The coefficients of thermal expansion of other semiconductor materials used for the production of semiconductor chips, such as e.g. germanium, gallium arsenide, silicon-germanium, also lie within the range of values mentioned.

The linear thermal expansion coefficient of the sintered body 90 primarily depends on the ratio of the volume of the metal sheathing of the hybrid fiber 80 to the volume of the hybrid fiber 80. In this case, the linear thermal expansion coefficient is greater, the higher the volume proportion of the metal sheathing.

This means that the linear thermal expansion coefficient of a semiconductor chip to be fixed on the sintered body 90 can be achieved exactly by means of a suitable construction of the hybrid fibers 80.

For a semiconductor chip formed from silicon, for example, use is preferably made of hybrid fibers 80 with a metal sheathing made of copper in which the copper volume proportion amounts to 45% to 65% of the volume of the hybrid fibers 80. Thermal conductivities of about $1.2 \text{ W} \cdot \text{cm}^{-1} \cdot \text{K}^{-1}$ to $4.0 \text{ W} \cdot \text{cm}^{-1} \cdot \text{K}^{-1}$ can thus be achieved, depending on the type of carbon fibers used.

In comparison therewith, silicon has a thermal conductivity of about $1.25 \text{ W} \cdot \text{cm}^{-1} \cdot \text{K}^{-1}$. This means that with suitably constructed hybrid fibers 80, it is possible to produce sintered bodies 90 which have both the same thermal conductivity and the same coefficient of thermal expansion as silicon.

Figure 3B:
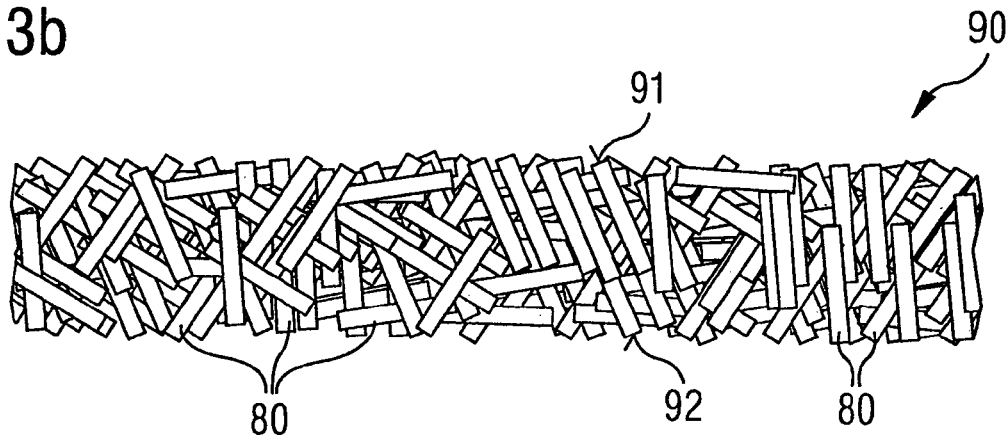

The sintered body 90 has a more or less pronounced surface roughness depending on the length 1 and the diameter d1 of the hybrid fibers 80. In order to eliminate said surface roughness, the surface roughness of the sintered body 90 can be reduced, at least at the locations provided for mounting a semiconductor chip, by means of a grinding method. FIG. 3*b* shows the sintered body 90 in accordance with FIG. 3*a* after its mutually opposite sides 91, 92 have been ground.

Figure 3C:
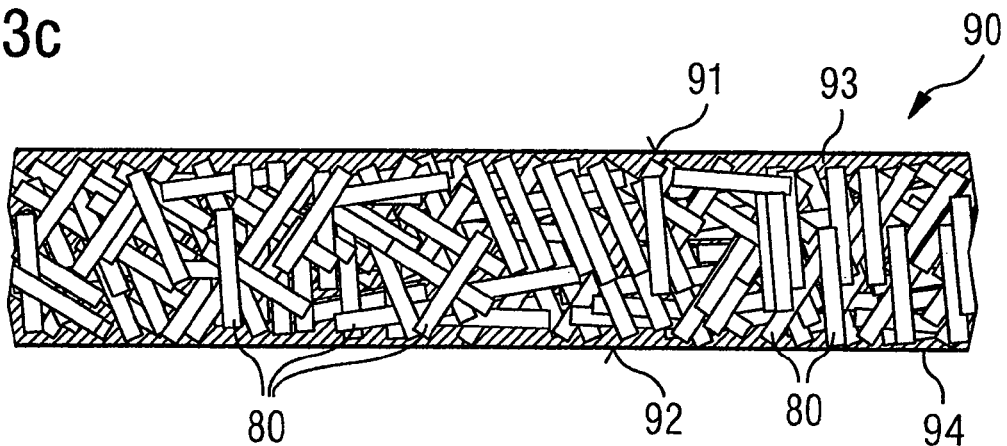

Since the hybrid fibers 80 are broken open as a result of the grinding of the surface 91, 92 in the region near the surface and a large portion of the carbon fibers of the hybrid fibers 80 near the surface is thus uncovered, it is advantageous to seal the ground surfaces 91, 92 with metal layers 93, 94, as is shown in FIG. 3*c*. Depending on the further use of the sintered body 90, various metals or alloys are suitable for sealing purposes.

For the production of a soldering connection between a sintered body 90 and a soldering partner, for example a semiconductor chip, a grinding operation and/or a subsequent metallization 93, 94 can be dispensed with in the surface region of the sintered body 90 to which the soldering partner is to be soldered, since the solder used compensates for the unevennesses of the surfaces 91, 92. The same correspondingly holds true if an electrically conductive adhesive is used instead of a solder.

A metallization 93, 94 can nevertheless be applied to the surfaces 91, 92 in order to increase the solderability thereof and to seal the surfaces 91, 92.

As already explained above, the sintered body 90 can be produced in a predetermined form depending on later use if a suitably formed negative mold is used for this purpose.

Furthermore, it is also possible to alter the form of the sintered body 90 after the sintering operation, in particular to process it mechanically. In particular stamping, drilling, milling, grinding, polishing, embossing, bending or laser cutting are suitable for this purpose. These processing methods may be effected after the sintering operation in each production phase of the sintered body 90, in particular in the case of the sintered bodies 90 in accordance with FIGS. 3*a*, 3*b*, 3*c*. The metallic coatings 93, 94 can be produced before or preferably after the conclusion of the mechanical processing of the sintered body 90.

Moreover, before or preferably after the mechanical processing, it is possible to apply to the sintered body 90 at least in sections one or a plurality of layers made of nickel-phosphorus (NiP), nickel (Ni), silver (Ag), gold (Au) or tin (Sn) or an alloy with at least one of said materials, in order to increase the solderability. Such layers may serve as contact material for eutectic bonding methods or diffusion soldering methods.

The subsequent FIGS. 4*a* to 4*h* show the production of a printed circuit board formed from such sintered fibers using the example of the printed circuit board 1 in accordance with FIG. 1.

Figure 4A:
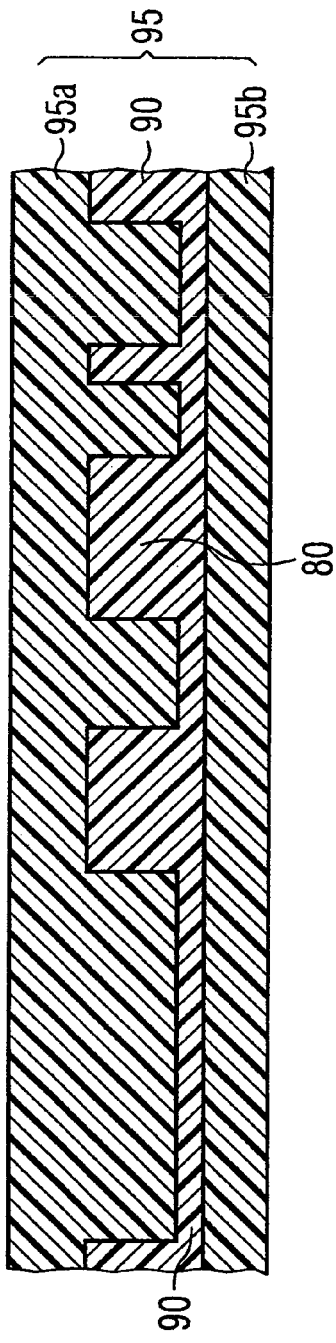
FIG. 4 shows a plurality of steps of a method for the production of the first printed circuit board, the capacitor and the resistor in accordance with FIG. 1.

As can be seen from FIG. 4*a*, a sintered body 90 can be produced by a multiplicity of hybrid fibers 80 (which are not illustrated and are only designated symbolically) comprising e.g. copper-sheathed carbon fibers being pressed onto one another in a mold 95 comprising mold parts 95a, 95b, and being sintered together at temperatures of between preferably 750° C. and 950° C.

Figure 4B:
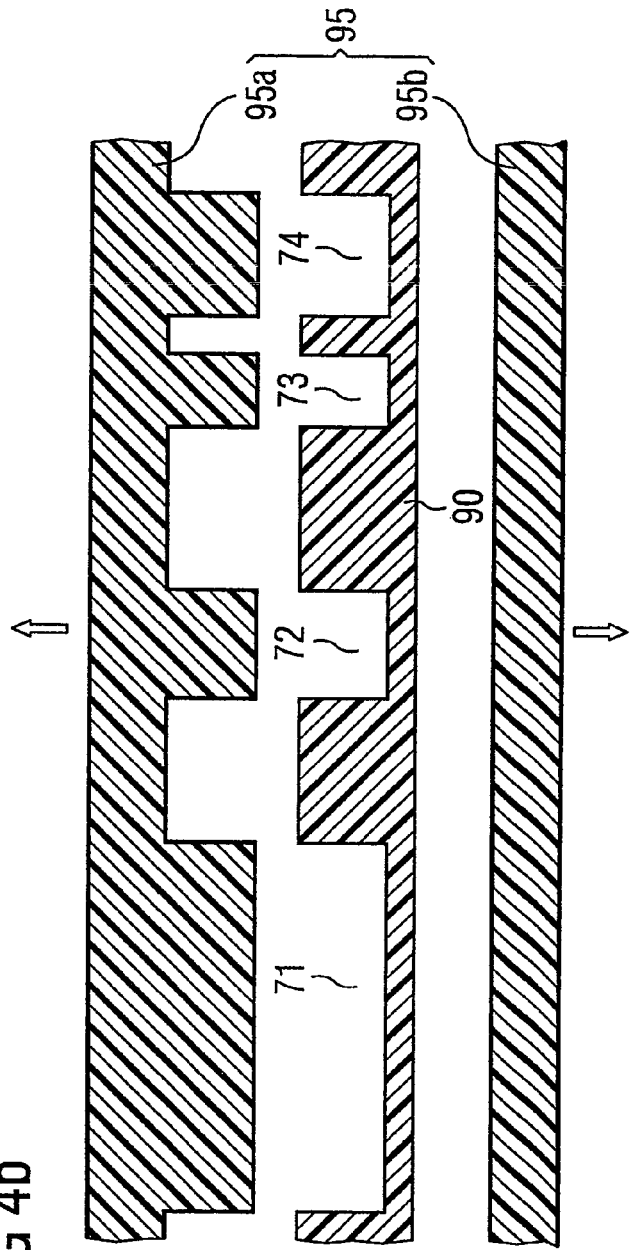

This gives rise to an electrically conductive sintered body 90 having depressions 71, 72, 73, 74 by virtue of a suitable configuration of the mold 95, which can be seen as the result from FIG. 4b after the opening of the mold 95. FIG. 4c again shows the sintered body 90 removed from the mold with its depressions 71, 72, 73, 74, which extend, proceeding from the first side 16 of the sintered body 90, in the direction of the second side 17 opposite to the first side 16. The depressions 71, 72, 73, 74 are preferably embodied such that they are at a distance from the second side 17.

Afterward, a dielectric 31, 32, 33 is filled, for example pressed or printed, into the depressions 72, 73, 74, but not into the depression 71, and is subsequently baked in, which is illustrated as the result in FIG. 4d.

The arrangement in accordance with FIG. 4d is then ground back proceeding from the second side 17, with the result that the sintered body 90 decomposes into electrically conductive sections 11, 12, 13, 14 which are spaced apart from one another and electrically insulated from one another, which is shown in FIG. 4e.

The sections 12, 13, 14, 15 remain stably connected to one another, however, by the dielectric 31, 32, 33. The section 11 remains fixedly connected to the sections 12, 13, 14, 15 by means of a dielectric section that is not shown in the sectional view shown.

Since no dielectric was filled into the depression 71 in accordance with FIG. 4d, an opening 19 arises after the grinding-back process, and the semiconductor chip 50 in accordance with FIG. 1 can later be positioned in said opening.

The electrically conductive sections 11, 12, 13, 14, 15 and the sections 31, 32, 33 formed from the dielectric form the sections of the printed circuit board 1 in accordance with FIG. 1 which are provided with the same reference symbol.

Optionally, the first side 17 of the sintered body 90 may additionally be ground in plane fashion after the dielectric 31, 32, 33 has been filled in. In this case, the grinding of the first and second sides 16, 17 is embodied in such a way that a predetermined thickness d3 of the printed circuit board 1 to be produced is reached. The thickness d3 is predetermined and depends on the geometry of the arrangement in accordance with FIG. 1.

FIG. 4f shows the arrangement in accordance with FIG. 4e onto which, in order to produce the dielectric layer 39 in accordance with FIG. 1 as already explained in detail above a paste having preferably a high dielectric constant has been printed onto the first side 16 above the electrically conductive section 13.

As shown as the result in FIG. 4g, a resistance layer 18 is then applied to the first side 16 in accordance with FIG. 4f, and it makes contact with the electrically conductive section 12. Furthermore, a section 18a of the resistance layer 18 extends over the dielectric layer 39 and forms together with the electrically conductive section 13 a capacitor 6.

The printing on of the dielectric layer 39 and/or of the resistance layer 18 is preferably effected after the planarization of the first side 16, but may be effected either before or after the grinding back of the second side 17.

Afterward, the electrically conductive sections 11, 12, 13, 14, 15 are additionally provided with a solder 60, 62, 63, 64, 65 on the second side 17. This can be effected in a simple manner by wetting the second side 17 with liquid solder, for example with tin or with a tin-containing solder, since such a solder adheres only to the electrically conductive sections 11, 12, 13, 14, 15 but not to the sections 31, 32, 33 of the dielectric.

It goes without saying that a printed circuit board 1 produced in this way may also be provided with solder on both sides 16, 17, e.g. by immersion in liquid solder. The completed printed circuit board 1 with the solder sections 60, 62, 63, 64, 65 is shown in FIG. 4h.

As an alternative to solder, layers for eutectic bonding methods may also be applied to the surface, in particular alloys based on layers containing silver (Ag) and/or gold (Au).

Furthermore, the sintered body for the production of a printed circuit board, instead of being produced from the described hybrid fibers that are sintered together, may also be produced from a sintered mixture of carbon fibers and a metal, preferably copper or a copper-containing metal. The same values as for the production of the sintered body from the hybrid fibers described hold true for the dimensions of the carbon fibers used in this case and the preferred volume proportion of the metal in the total volume comprising the carbon fibers and the metal, and also for the sintering temperatures and the sintering pressure.

LIST OF REFERENCE SYMBOLS

1 First printed circuit board
2 Second printed circuit board
3 Conductor layer
4 Insulating carrier plate
5 Conductor layer
6 Capacitor
10 First basic body
11-15 Sections of the first printed circuit board
16 First side of the first printed circuit board
17 Second side of the first printed circuit board
18 Resistance layer
18a Section of the resistance layer
19 Opening
21-24 Sections of the second printed circuit board
26 First side of the second printed circuit board
27 Second side of the second printed circuit board
31-33 Dielectric
39 Dielectric layer
41-43 Dielectric
50 Semiconductor chip
51 First load connection
52 Second load connection
53 Control connection
60-69 Solder, eutectic bonding connection
71-74 Depression
80 Hybrid fiber
81 Sheathing
82 Carbon fiber
90 Sintered body
91 First side of the sintered body
92 Second side of the sintered body
93 Metallization
94 Metallization
95 Mold
95a Upper mold part
95b Lower mold part
d1 Diameter of the hybrid fiber
d2 Diameter of the carbon fiber
d3 Thickness of the first printed circuit board
l Length of the hybrid fiber

What is claimed is:

1. A power semiconductor module comprising a controllable semiconductor chip, a first printed circuit board, a second printed circuit board, and one or several passive components, wherein
the first printed circuit board has a conductor track structure, and also an opening in which the semiconductor chip is arranged,
the second printed circuit board has a conductor track structure,
the one passive component or each of the several passive components are arranged either on the first printed circuit board or on the second printed circuit board, and
the conductor track structure of the first printed circuit board has at least one section which is formed in one piece and which extends continuously between two mutually opposite sides of the first printed circuit board, the at least one section of the first printed circuit board being formed from hybrid fibers sintered together and formed from carbon fibers sheathed by a metallization.

2. The power semiconductor module according to claim 1, wherein the conductor track structure of the second printed circuit board has at least one section which is formed in one piece and which extends continuously between two mutually opposite sides of the second printed circuit board, the at least one section of the second printed circuit board being formed from hybrid fibers sintered together and formed from carbon fibers sheathed by a metallization.

3. The power semiconductor module according to claim 1, comprising an electrical resistor arranged on the first printed circuit board or on the second printed circuit board.

4. The power semiconductor module according to claim 3, wherein the electrical resistor is printed on the first printed circuit board or on the second printed circuit board.

5. The power semiconductor module according to claim 1, wherein a first section of the conductor track structure of the first printed circuit board or a first section of the conductor track structure of the second printed circuit board together with an electrically conductive layer formed from an electrically conductive paste forms a printed capacitor.

6. The power semiconductor module according to claim 5, wherein a barium titanate layer is arranged between the first section and the electrically conductive paste.

7. The power semiconductor module according to claim 6, wherein barium oxide (BaO) and/or lanthanum oxide ($La_2O_3$) and/or neodymium oxide ($Nd_2O_5$) are/is admixed with the barium titanate layer.

8. The power semiconductor module according to claim 1, wherein an electrical resistor and a capacitor are printed on the first printed circuit board or on the second printed circuit board and connected up to form a low-pass filter or to form a high-pass filter.

9. The power semiconductor module according to claim 1, wherein a first load connection of the semiconductor chip is fixedly connected to a conductor layer.

10. The power semiconductor module according to claim 9, wherein a second load connection of the semiconductor chip is fixedly connected to the conductor track structure of the second printed circuit board.

11. The power semiconductor module according to claim 10, wherein the first load connection and the second load connection are arranged on mutually opposite sides of the semiconductor chip.

12. The power semiconductor module according to claim 9, wherein the semiconductor chip is arranged at least in sections between the second printed circuit board and the conductor layer.

13. The power semiconductor module according to claim 9, wherein the first printed circuit board is arranged at least in sections between the second printed circuit board and the conductor layer.

14. The power semiconductor module according to claim 13, wherein, in the first printed circuit board, an electrically conductive connection is formed which extends between two mutually opposite sides of the first printed circuit board and which electrically conductively connects a conductor track structure of the second printed circuit board to the conductor layer.

15. The power semiconductor module according to claim 9, wherein the conductor layer is arranged on an insulating carrier plate.

16. The power semiconductor module according to claim 15, wherein the insulating carrier plate has or is formed from aluminum oxide ($Al_2O_3$).

17. The power semiconductor module according to claim 15, wherein the conductor layer comprises hybrid fibers which are sintered together and are formed from carbon fibers sheathed by a metallization.

18. The power semiconductor module according to claim 17, wherein the metallization has or is formed from copper or a copper alloy.

19. The power semiconductor module according to claim 9, wherein the conductor layer is formed from silver, copper or an alloy with at least one of said materials.

20. The power semiconductor module according to claim 1, wherein the first printed circuit board and/or the second printed circuit board are formed from an electrically conductive basic body.

21. The power semiconductor module according to claim 20, wherein at least one electrically conductive basic body comprises carbon fibers which are sheathed by a layer made of metal or which are mixed with a powder or granules made of metal and are sintered together with the metal.

22. The power semiconductor module according to claim 21, wherein the metal contains or is formed from copper or a copper alloy.

23. The power semiconductor module according to claim 20, wherein the first printed circuit board and/or the second printed circuit board have sections, which are formed from the electrically conductive basic body and which are electrically insulated from one another by a dielectric.

24. The power semiconductor module according to claim 23, wherein the dielectric is glass, a glass fabric or a plastic molding composition.

25. The power semiconductor module according to claim 1, wherein the controllable semiconductor chip is connected without bonding wires.

26. The power semiconductor module according to claim 1, wherein the first printed circuit board and/or the second printed circuit board have a thickness of 50 µm to 350 µm.

27. The power semiconductor module according to claim 1, wherein the power semiconductor module is formed without bonding wires.

28. A power semiconductor module comprising a controllable semiconductor chip, a first printed circuit board, a second printed circuit board, and one or several passive components, wherein:
the first printed circuit board is arranged between the second printed circuit board and a conductor layer;
the first printed circuit board has a conductor track structure and an opening between the second printed circuit board and the conductor layer in which the semiconductor chip is arranged;

the first printed circuit board further has at least one section formed in one piece extending between two mutually opposite sides of the first printed circuit board, the at least one section of the first printed circuit board being formed from hybrid fibers sintered together and formed from carbon fibers sheathed by a metallization;

the semiconductor chip and the first printed circuit board each have a first side adjacent the second printed circuit board and a second side adjacent the conductor layer;

the semiconductor chip is electrically connected to the second printed circuit board at the first side of the semiconductor chip and to the conductor layer at the second side of the semiconductor chip;

the second printed circuit board has a conductor track structure; and the one passive component or each of the several passive components are arranged either on the first printed circuit board or on the second printed circuit board.

* * * * *